United States Patent [19]
Alm, Jr. et al.

[11] 4,099,137
[45] Jul. 4, 1978

[54] HIGH SPEED PHASE LOCK CONTROL FOR FREQUENCY SWITCHING

[75] Inventors: Benjamin C. Alm, Jr., Arnold; Francis W. Hopwood, Severna Park; Robert A. Jelen, Arnold; John P. Muhlbaier, Joppa; Joseph F. Wright, Jr., Columbia, all of Md.

[73] Assignee: Westinghouse Electric Corp., Pittsburgh, Pa.

[21] Appl. No.: 805,498

[22] Filed: Jun. 10, 1977

[51] Int. Cl.$^2$ ............................................. H03B 3/08
[52] U.S. Cl. ..................................... 331/16; 328/155; 331/1 A; 331/179
[58] Field of Search .................... 331/16, 1 A, 179; 328/155

[56] References Cited
U.S. PATENT DOCUMENTS 3,689,849  9/1972  Swanson et al. .................... 331/1 A Primary Examiner—John Kominski
Attorney, Agent, or Firm—H. W. Patterson

[57] ABSTRACT

A digitally controlled microwave phase lock loop for switching rapidly from one lock frequency to another is disclosed. A digital word corresponding to a desired input voltage for a selected frequency is converted to an analog voltage for application to the coarse tuning port of the loop's voltage controlled oscillator. Prior to switching to another frequency, the error voltage for the fine tuning port is compared with a zero error reference voltage. The least significant bit of the digital word for such frequency is increased or decreased by one depending on the direction difference between the compared voltages. This incrementally changed word controls the coarse tuning voltage during the next selection of the particular frequency. The system is initialized by repetitively selecting each of the possible frequencies until the digital word for each selected frequency is within one increment of the zero error reference voltage for the fine tuning port.

7 Claims, 3 Drawing Figures

HIGH SPEED PHASE LOCK CONTROL FOR FREQUENCY SWITCHING

GOVERNMENT CONTRACT

The invention herein described was made in the course of or under a contract or subcontract with the Department of the Air Force.

BACKGROUND OF THE INVENTION

1. Field of the Invention

The present invention relates to phase lock loop control; and more particularly, to an improved phase lock loop control for the rapid switching from one lock frequency to another.

2. Description of the Prior Art

Modern radars require the use of coherent microwave signal generators capable of extremely rapid frequency switching; such as in the order of 4 microseconds, for example. Within such time period, not only must the device be generating the new frequency, but it must also be in a definite locked phase relationship with a reference frequency.

For applications requiring switching speeds in the order of milliseconds, for example, a phase lock loop utilizing slowly varying sweep voltages is practical. In this instance, the frequency of the oscillator to be locked is slowly swept with an analog voltage sweeper until it passes through the desired voltage to provide the frequency point at which phase lock occurs. The acquisition of the phase lock is monitored through the use of the In-phase (I) mixers and quadrature (Q) mixers. Phase lock occurs through the quadrature mixture resulting in a constant DC voltage at the associated (I) mixer. This DC voltage disables the sweeper to complete the acquisition when it reaches a certain threshold. To insure reliable acquisition, the oscillator must be swept through the desired frequency at a maximum rate. This rate must be such that a frequency range corresponding to the servo loop bandwidth ($F_L$) is traversed during a time period of at least ($N/F_L$), where (N) is considered to be in the neighborhood of ten. If the oscillator searches linearly over a band B during time T, then $$(B/T) \leq (F_L/N/F_L)$$

or $$T \geq BN/F_L^2$$

For example, if the search band is 100 mHz and the loop bandwidth is 1 mHz, it takes about 1 millisecond to search the band. This time can be shortened by the use of conventional pre-positioning and narrower search ranges. However, such pre-positioning and narrower search ranges often lead to a row of "pot" adjustments which, in fact, fail to decrease the speed of acquisition significantly without becoming vulnerable to voltage controlled oscillator frequency drift due to temperature and aging.

In order to increase the switching speed and the phase settling time, it has also been proposed to employ two sweeping rates. The initial sweep is very rapid and sweeps the voltage controlled oscillator to nearly its correct frequency and the second sweep is slower for completing the lock. The output of the final loop mixer is monitored by a low pass filter and voltage comparator. The filter impulse response is such that the rapidly decreasing linear frequency modulated waveform caused by the search is sensed in such a way that the search is disabled as the VCO passes through the desired frequency. Such a proposed system increases the switching speed and particularly reduces the phase settling time so that a lock occurs between frequencies in the neighborhood of forty microseconds, for example.

In both of the aforementioned analog switching techniques, the system is limited by the decision making processes; that is, the system has to determine the precise time at which the sweeping voltage passes through the desired frequency.

In contrast to the search and acquisition techniques of the previous phase locked loops when switching from one desired lock frequency to another, is the digital method of changing the input voltage to the VCO. It is a known fact, that phase lock occurs very rapidly, if upon changing the loop reference frequency, the oscillator coarse tuning voltage corresponds to the coarse tuning voltage of the desired lock frequency. In other words, acquisition occurs quickly only if the frequency errors are small compared to the loop bandwidth. However, such an ideal situation has not heretofore been feasible because of frequency drifts in microwave oscillators caused by temperature change and aging.

Thus, it is desirable to provide an improved digitally controlled microwave phase lock loop which eliminates the decision making processes associated with conventional analog circuits to provide very fast frequency switching and phase settling times, regardless of the temperature and aging of the particular apparatus.

SUMMARY OF THE INVENTION

Broadly, the present invention relates to a system and method of digitally controlling a phase lock loop for rapidly switching between a plurality of selected frequencies. Such a system and method automatically changes the coarse tuning voltage in a direction to decrease any fine tuning error voltage for each of the frequencies, thereby constantly providing a more correct digital representation of the coarse tuning voltage regardless of the temperature and aging of the voltage controlled oscillator.

More specifically, the present invention increments or decrements the least significant bit of the digital word in a direction to compensate for any drift each time the previously changed digital word is selected to control its associated frequency. The proper correction is sensed while the digital word is controlling one frequency; and the digital word for one selected frequency is changed during the switching period from such one frequency to the next frequency.

The system also provides for automatically forming the proper digital words upon turning on the system by sequentially selecting each frequency; and changing the digital word until it is within the range of a single increment of the zero error reference voltage of the fine tuning port.

DESCRIPTION OF THE PREFERRED EMBODIMENT

A system and method of the present invention is particularly useful in a radar system which remains in a frequency agile mode; wherein the locked oscillator is continually changing frequency in either a cyclic or a pseudorandom pattern, such that each available frequency is selected during some short but undefined time period. The system remains in the frequency agile mode except during an initialization period which occurs at system turn on; and in the event of a power transient, or other anomalous event.

It is common practice to synthesize a set of stable microwave frequencies for use in radars and other applications through the use of a microwave voltage tuned oscillator which is phase locked to the sum of several multiples of a stable crystal oscillator. For example, a crystal oscillator provides a frequency $F_O$ and is multiplied by integers $N_1$ and $N_2$ (selectable) to form references for a phase lock loop which locks the microwave oscillators to frequency $(N_1 + N_2) F_O$. There are a large number of functionally similar synthesis techniques in common usage. However, it is noted that the exact nature of the synthesis technique is unimportant to the system and method of the present invention except that such system and method consists of a phase locked oscillator which must be switched between several stable reference frequencies.

Figure 1:
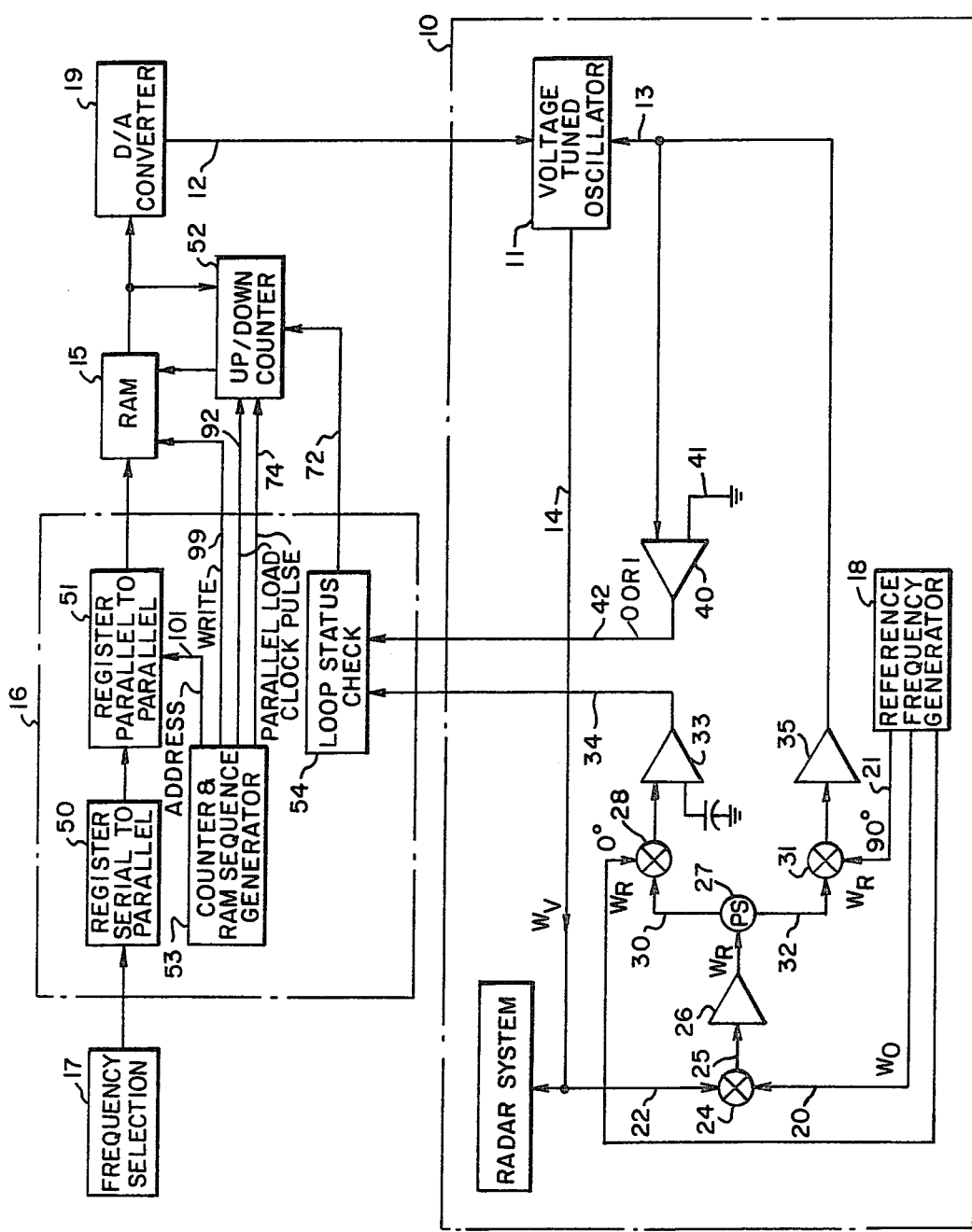
FIG. 1 is a functional block diagram of a phase lock loop control system according to one embodiment of the present invention.

Referring to FIG. 1, a phase lock loop within the dashed lines referred to at 10 includes a microwave voltage tuned oscillator 11 having a coarse tuning input port connected to line 12 and a fine tune input port connected to line 13. The frequency output of the oscillator 11 occurs on line 14 and is a frequency that depends on the value of the input voltages applied to the coarse tuning port 12. The coarse tuning voltage on line 12 is supplied by a digital-to-analog converter 19, the input of which is supplied by a random access memory 15, a control unit within the dashed lines referred to at 16, and a frequency selection means 17, all of which will be described hereinafter.

Assuming that the microwave voltage tuned oscillator 11 is to be phase locked to the output frequency $W_V$ on the output line 14, which is the sum of frequencies $W_O$ and $W_R$, a conventional reference frequency generator 18 outputs the frequency $W_O$ on line 20 and the frequency $W_R$ on line 21 while the voltage appearing on line 12 is such that the oscillator 11 is outputting the frequency $W_V$ on the line 14. The frequency $W_V$ on line 22 is mixed with the frequency $W_O$ on line 23 at a conventional microwave mixer 24 to generate and IF frequency that corresponds to the frequency $W_R$ on line 25. This frequency is amplified by a conventional broad band amplifier 26 and output to a 3 db power splitter 27. The power splitter 27 then provides the frequency $W_R$ to an I mixer 28 over line 30 and to a Q mixer 31 over line 32. Acquisition of phase lock is monitored by a comparator 33 which senses a DC level out of the I mixer 28 upon phase lock. This determination of phase lock is output over line 34 to the control unit 16 as described hereinafter. The output of the Q or quadrature phase mixer 31 is applied to an amplifier 35, the output of which is connected to the fine tuning input port over line 13 of the oscillator 11. This is a DC or video output which constitutes the error voltage for the fine tuning of the oscillator 11. It is assumed, that the loop 10 is the well-known over-damped Type II phase lock loop of a bandwidth $F_L$ as is well known by those skilled in the art. It is also understood, that the lock frequency is rapidly changed as $W_R$ and/or $W_O$ are changed, and that $W_O$ and $W_R$ can be changed arbitrarily very rapidly in a conventional manner so that the speed with which $W_V$ is changed and phase lock occurs is governed by the present invention. Various techniques, such as digital frequency dividers are common and well known in the art and have the capability of changing frequencies during a period of less than 100 nanoseconds for example.

If the characteristics of the oscillator 11 always remain the same regardless of temperature and aging, then the proper data word from the random access memory 15 to the D to A converter 14 will always provide the precise coarse tuning voltage required to shift to a new frequency with little or no error voltage occurring on line 13 at the fine tuning port of the oscillator 11. However, drifting due to temperature, aging, power supply variation, or some other reason causes the output frequency $W_V$ to drift creating an error voltage on the fine tuning port 13. This error voltage then of course increases or decreases the tuning voltage to ultimately lock the loop so that the two frequencies are in the proper phase relationship. In the event that the voltage on the coarse tuning port 12 is too high for a particular frequency and phase, then the error voltage on line 13 will be correspondingly low. Similarly, if the voltage on the coarse tuning port from line 12 is too low, then the error voltage on the fine tuning port of line 13 will be too high. Thus, the loop is self-correcting to maintain the proper phase relationship with the reference frequency. When the reference voltage (frequency) at the output of the amplifier 35 is the same as the output frequency on line 14 with the loop, in a manner to maintain the proper phase, the fine tuning voltage on line 13 corresponds to a nominal zero error fine tune voltage. When this occurs, the loop is not only in a locked condition, but phase settling is also completed.

In accordance with the present invention, a comparator 40 compares the fine tuning voltage on the line 13 with the nominal zero error fine tuning voltage at its input 41. In the event that the fine tuning voltage on the line 13 is too high, a logic signal "zero" is output on line 42. Conversely, if the fine tuning voltage is too low, a logic "one" is output on the line 42.

The frequencies that are rapidly changed, may be generated by any particular selection source such as 17 and input in a serial fashion to a serial-to-parallel shift register referred to at 50. The address or selection from the shift register 50 is then input to a parallel-to-parallel shift register 51 in order that the register address or selection can be processed while the frequency selection device 17 is inputting the next selected frequency. The output of the register 51 is then input to the random access memory 15 for selecting the appropriate data word corresponding to the selected frequency for input to the digital-to-analog converter 19. In updating the channel, the data word is either decremented or incremented by one least significant bit in an up/down counter 52 depending on the "zero" or "one" output of the comparator 40. The resulting new frequency data word is then input to the random access memory 15 to be used when that particular channel is again selected. At this point, it should be noted as described in more detail hereinafter that the frequency data for a given channel is updated after the device has been switched out of that channel. The data was measured by the comparator 40 and introduced to the counter and ram sequence generator 53 through a loop status check 54 the last time that such channel was utilized. This is important to the system and method of the present invention in that the introduction of phase transients is avoided in the phase lock loop, which transients are generally undesirable for system applications.

Prior to a detailed discussion of the manner in which the data word is updated in the random access memory 15 for input to the converter 19, it is noted that the necessary condition that the least significant bit of the frequency data word corresponds to an oscillator open loop frequency change of significantly less than the phase lock loop bandwidth. For example, if the loop bandwidth is one mHz, an appropriate frequency data least significant bit is about 10 kHz. Introduction of the periodic update to the frequency data word results in a limit cycle in the open loop frequency on the output 14. Each time a channel is selected, the frequency on line 14 will differ from the last time that the channel was used by $n$ amount equal to the least significant bit of the frequency data digital word. This introduces a systematic phase step of $$\Delta \phi = \frac{F_{LSB}}{A_o \cdot \frac{dV}{d\phi} \cdot \frac{dF}{dV}}$$

from one usage of a channel to the next. Here, the least significant bit frequency ($F_{LSB}$) is the incrementation of the frequency data. $A_o$ is the gain of the DC video amplifier 35; and $dV/d\phi$ is the sensitivity of the mixer 31, and $dF/dV$ is the sensitivity of the fine tuning port of line 13 of the oscillator 11. By updating the frequency data word in this manner, oscillator drift rates up to the following $$\frac{dF}{dT}/\max = \frac{F_{LSB}}{T}$$

where, $F_{LSB}$ is the frequency data incrementaion and T is the maximum time between two selections of a channel. For example, if the least significant bit is 10 kHz and a channel is selected no less than every 100 milliseconds, the drift rate of the oscillator due to temperature and other effects can be as much as 10,000 Hz/100 milliseconds or 100 kHz/second. This is much greater than is normally encountered for oscillators of even modest quality. Thus, it is guaranteed that the frequency data words is correct to within one least significant bit each time a channel is selected. This data word is used to provide the precise voltage for the new frequency when a channel is selected. Since the least significant bit and the frequency pre-positioning is by definition much less than the phase lock loop bandwidth, phase locks occur in time periods of about a reciprocal bandwidth.

Figure 2:
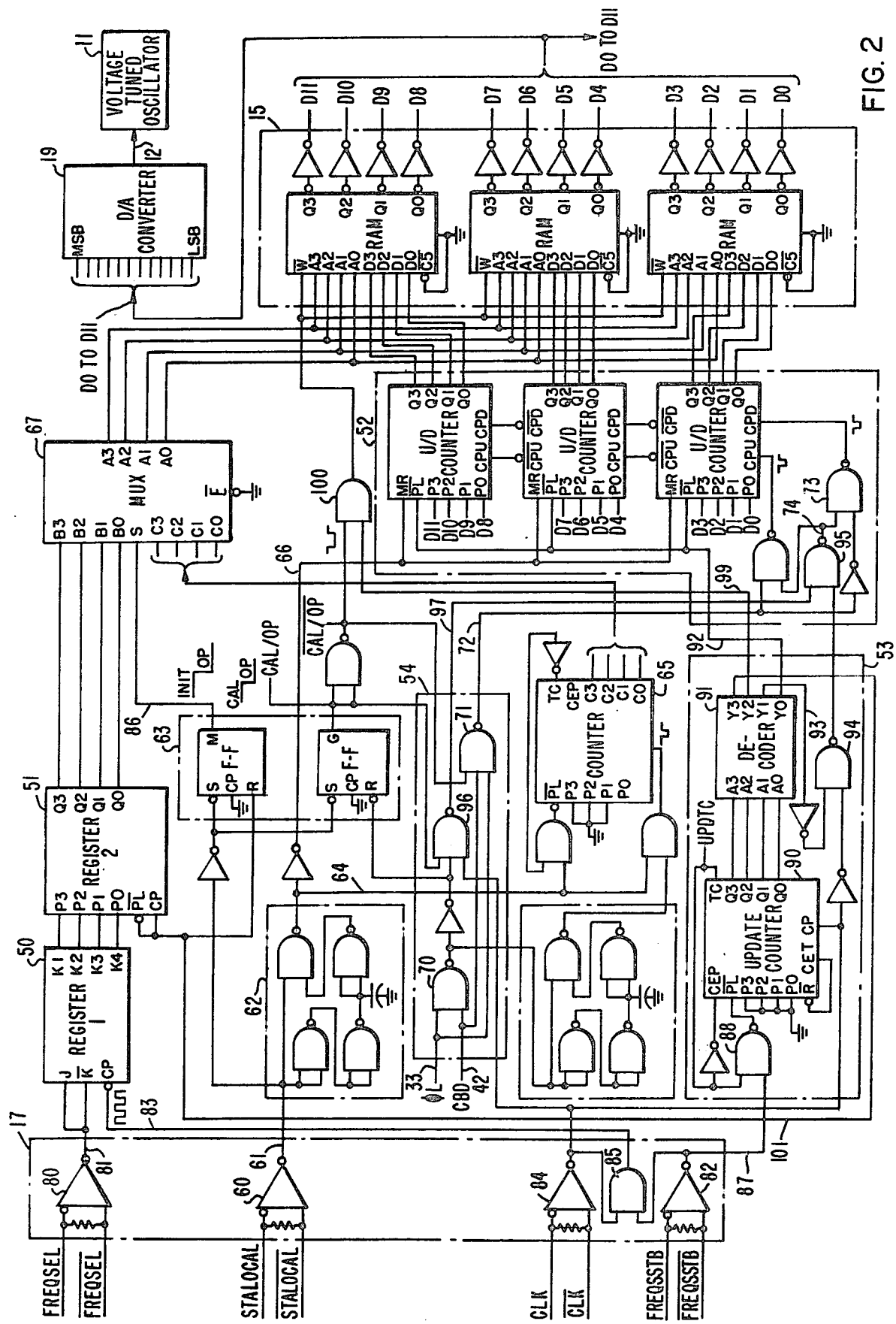
FIG. 2 is a more detailed schematic representation of the control of FIG. 1 according to one embodiment of the invention.

Referring to FIG. 2 in connection with the timing diagram of FIG. 3, a more detailed description of the invention will be given in connection with its operation.

The system is initialized by a signal input STALO-CAL to a conventional line receiver 60 which produces a distinctive output on line 61. This distinctive output on 61 initiates the operation of a clock or a pulse generator 62, which generates clock pulses over line 64 to set a counter 65 to the first address for generating internal addresses during initialization. The output on line 66 resets the up/down counter 52; and also conditions a conventional multiplexing device 67 to accept such addresses from the counter 65.

The operation of the multiplexer 67 addresses the random access memory 15 to provide the appropriate digital value corresponding to a particular address frequency to the digital to analog converter 19. This of course, places the appropriate analog voltage to the coarse input port 12 of the oscillator 11 as described in connection with FIG. 1.

When the loop is locked as previously described, an output occurs on lines 33 an 42 (FIG. 1) and is input to gate 70 of the loop status check circuit 54. Also, an input is applied to gate 71 which causes a distinctive output on line 72 for operating the up/down counter 52 through gate 73 until such time as the comparator 40 of FIG. 1 changes between a zero output or a one output on the line 42 which indicates that the digital value for the frequency selected is accurate within one least significant bit. During this initialization mode, the counter 52 continues to change the least significant bit in one direction through gate 73 and thus change the particular digital value in the RAM 15 to provide an accurate digital data word. The clock 105 changes the address of the counter 65 which selects a new address in the RAM 15 through the multiplexer 67 to repeat the procedure as previously described. This occurs until all of the selected frequencies of the system have been calibrated to within one least significant bit of the zero error of the fine tuning port.

Once the initialization has been completed, data referred to as FREQSEL is input to a line receiver 80 which is a four bit address that is applied serially over line 81 to the serial-to-parallel shift register 50. Simultaneously, a frequency strobe signal is applied to a line receiver 82 which produces an output on line 83 which output is so timed to encompass the four address bits serially received over the line 81. At the same time, a line receiver 84 is clocked to generate an output through gate 85 to provide the proper timing for the strobe pulse on line 83. It should be noted that the input to the line receiver 60 previously described for the initialization mode is removed during the operation mode. In response to the removal of the initialization mode, the switching circuit 63 is reversed to generate a distinctive low on its output 86 which operates the multiplexing device 67 to receive its input from the parallel-to-parallel register 51.

The strobe input FREQSSTB also produces its pulse on line 87 which is input through gate 88 to an update counter 90 of the counter and RAM sequence generator 53. The output of the counter 90 is input to a decoder 91 which generates four pulses in sequence over its outputs $Y_0$ through $Y_3$. The first of these pulses loads the up/down counter 52 with the previous frequency data word over line 92 to the parallel input terminal of the counter 52. It is noted, that the outputs $D_0$ through $D_{11}$ of the random access memory 15 are connected to the parallel load inputs $D_0$ through $D_{11}$ of the counter 52 so that the particular frequency data word that was output at the RAM 15 is loaded into the up/down counter 52 upon the occurrence of the output pulse on the line 92.

The next output pulse to occur from the sequence generator 53 is on line 93 which produces an input to gate 94, the output of which is connected to the input of gate 95 for enabling the changing of the up/down counter 52 by one increment. When the loop status check circuit 54 determines that the loop is locked and that the output on line 42 (FIG. 1) is either slightly above or slightly below the zero error fine tune voltage to either cause a gate 71 to produce a distinctive output over line 72 to the input of the gates 73. This will then allow pulse output of gate 94 to clock the counter 52 either up or down depending on which exists.

The loop status check provides a means of sensing the status of the two monitored loop parameters and to initiate appropriate action in both the initialization and operation modes. In the initialization mode, the output of gate 70 is held low until such time as both monitored loop parameters indicate the correct lock point (i.e., one least significant bit error). At this time gate 70 goes high resulting in a pulse from pulse generator 105 which clocks the interval address counter to the next address. Line 97 is the counter clock which is disabled when the correct lock point is detected and then enabled for the next frequency after the next address selection. During the above, gate 71 is held high which holds the up/down counter in the up position through line 72. In the operation mode, the output of gate 71 is the inverse of the fine tune reference voltage detector on line 42. (Line 33 will be held high at this time since the frequency being updated is already locked.) This data is transferred on line 72 to gates 73, which in turn enables the appropriate gate of the 73 pair to pass the clock pulse from gate 93; and thereby increment the counter either up or down.

Subsequent to the clocking of the counter up or down one bit, an output occurs on line 99 which is input to a gate 100, the output of which is connected to the write input of the RAM 15 to enter the updated or modified frequency data word from the counter 52 to the RAM 15.

Finally, an output occurs on line 101 of the sequence generator 53 which loads the four bit address that was serially received by the register 50 into the parallel register 51. The parallel loading of the address into 51 selects the address for addressing the RAM 15 to its next selected frequency, at which frequency the loop 10 of FIG. 1 will be locked. This is accomplished through the multiplexer 67 and the inputs $A_0$ through $A_3$ of each of the individual memories of the RAM 15.

Figure 3:
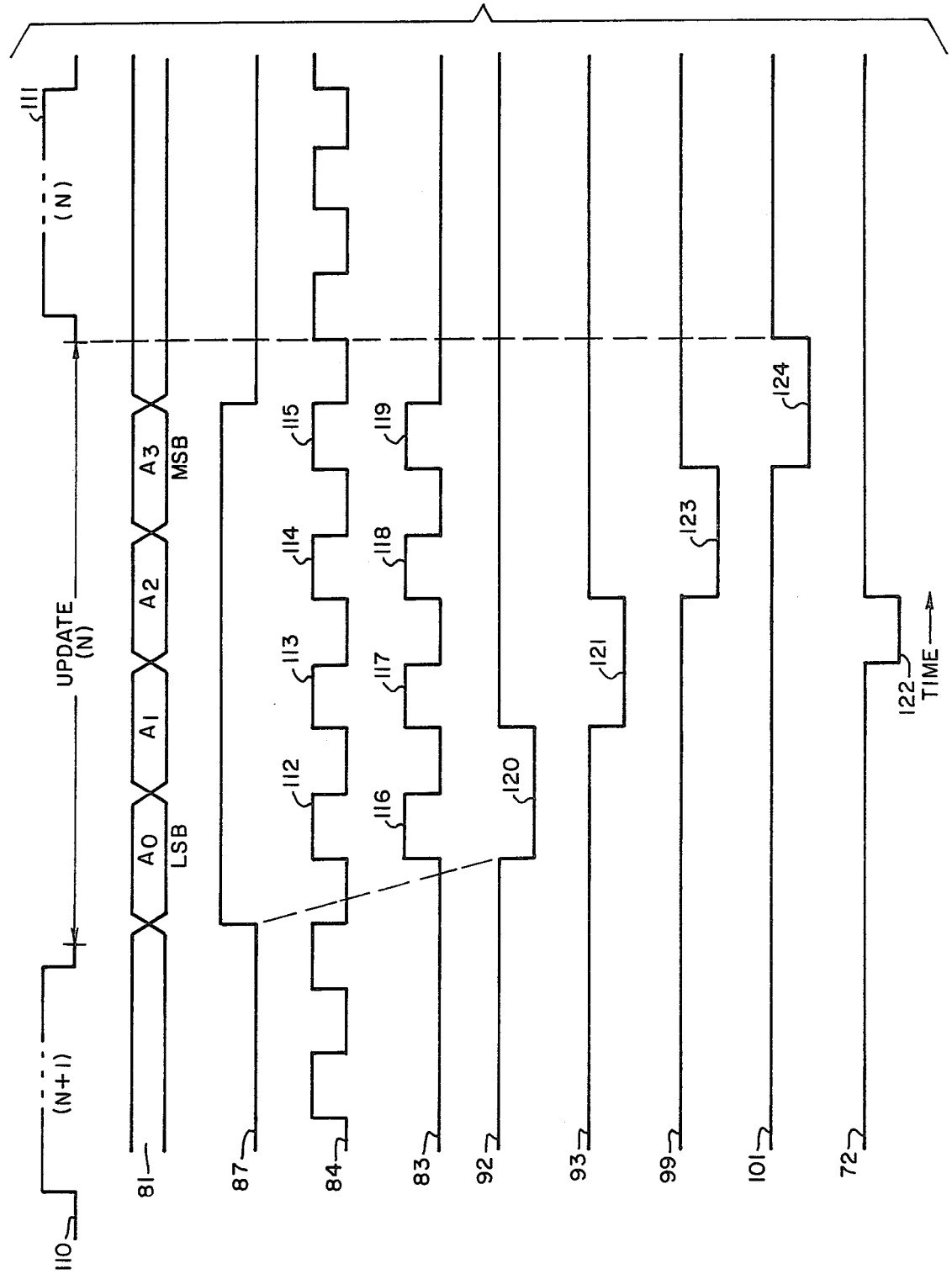
FIG. 3 is a timing diagram of FIG. 2.

Referring to the timing diagram of FIG. 3, the individual lines bear reference numerals corresponding to the output lines of FIG. 2 where appropriate. A line 110 represents a typical sequence of operation of a radar system in which the present embodiment of the invention may be used. Assuming that the different frequencies are selected in a sequence commencing with N followed by $N + 1$ and then by $N + 2$, the line 110 includes a portion 111 which represents the transmit-receive portion of the radar system for a particular frequency which has completed its cycle. Subsequent to the transmission reception cycle of the frequency N, the frequency N is being updated in accordance with the present invention; and during this time, the frequency $N + 1$, which is the most recent selected frequency is being addressed serially into the register 50 as previously described. Thus, during the updating of the digital frequency word, no frequency pulse is either being transmitted or received by the system. As the first bit is being addressed into the register 50, the strobe pulse occurs which encompasses four clock pulses referred to in the timing diagram as 112 through 115, each of which occurs in the middle of an address bit referred to $A_0$ through $A_3$. The leading edge of each of the clock pulses 112 through 115 clock the frequency $N + 1$ into the register 50 as noted by pulses 116 through 119.

During the time that the frequency $N + 1$ is being serially loaded into the register 50, the digital word for the frequency N is being updated. As noted by portion 120 of the line 92, the up/down counter 52 is loaded with the frequency data word N which was previously transmitted. Also, between the transmission of frequency N and frequency $N + 1$ and subsequent to the loading of the counter 52 the update clock is enabled as indicated by portion 121 of line 93. In response to the enabling of the update, the up/down counter 52 is clocked one bit in either an up or down direction to increment or decrement the least significant bit (LSB) of the frequency N which is stored in the counter 52 upon the occurrence of portion 120 of the line 92. The clocking of the counter is noted at portion 122 of the line 72. Then, the incremented or decremented frequency data word for the frequency N is written into the RAM 15 as noted by portion 123 of the line 99. Finally, the frequency $N + 1$ is addressed by letting the four bits $A_0$ through $A_3$ of the frequency $N + 1$ into the register 51 as noted by portion 124 of the line 101.

In summary, with respect to the initialization mode previously described, the up/down control is set in one direction with the clock being continuous and the frequency selection data being generated internally. The counter is stepped until the phase lock monitor (33 of FIG. 1) and the fine tuning port monitor (40 of FIG. 1) indicates correct data at which time the data word is stored for that frequency. In the operational mode, which after initialization, results in providing a frequency change, phase lock and phase settling in less than 10 microseconds with no adjustment required to the digital values corresponding to the different frequencies. Each time a new frequency is selected, and prior to the transmission thereof, the up/down counter is loaded with the previously transmitted frequency data word and the counter is clocked incrementally either up or down one time in accordance with the error of the fine tuning port during the prior transmission of such frequency. Such modified word is written into the random access memory for the next transmission of such frequency.

What we claim is:

1. A phase lock loop control system for switching rapidly between predetermined frequencies, comprising:
    a voltage controlled oscillator having a coarse tuning port and a fine tuning port,
    a digital to analog converter operative to apply an analog voltage to the coarse tuning port in accordance with a digital word applied to its input,
    a reference frequency generator,
    first means to generate an output in response to the locking of the phase of the oscillator with the reference frequency generator,
    comparator means to compare the voltage on the fine tuning port with a predetermined voltage indicative of zero error,
    a memory means for storing a plurality of said digital words, each of which corresponds to a single predetermined frequency, said memory means being connected to apply selectively addressed digital words to the digital to analog converter,
    an up/down counter operative when activated to change the value of each stored digital word in a selected direction,
    second means including the output of the first means and the comparison means to indicate the direction of error of the fine tuning voltage with respect to the zero error reference voltage, and sequencing means operative to activate the counter to change the value of each selected digital word by one increment in accordance with the indication of the second means.

2. A system according to claim 1 further comprising:

receiving means operative to receive serially in sequence a digital word corresponding to an address in the memory means for selecting a corresponding frequency data digital word, and wherein the sequencing means is operative to govern the counter to change the frequency data word for one frequency during the reception of the address for the data word of the next frequency.

3. A system according to claim 2 wherein the sequencing means includes means to load the up/down counter with the frequency digital word, enable the up/down counter to change the digital word value, transfer the changed digital word to the memory means, and address the memory means for selecting the next frequency in sequence.

4. A system according to claim 1, further comprising:

means to receive an initiation signal, means governed by the initiation signal to select a predetermined digital word, means responsive to the selection means to operate the value of said digital word incrementally until the respective word is within one increment of the zero error reference voltage, and means responsive to the completion of the word value change to select the next predetermined frequency word.

5. A method of controlling the value of the coarse tuning voltage for each of a plurality of repetitively selected frequencies for a voltage controlled oscillator in a phase lock loop, said method comprising:

providing a digital word corresponding to a desired coarse tuning voltage for each of the selected frequencies, comparing the fine tuning voltage of the oscillator with a zero error reference voltage for each of the selected digital words when the loop is locked, changing the least significant bit of each one of the digital words by one increment in a direction to decrease the error of the fine tuning voltage during the time of switching from one selected frequency to another.

6. A method according to claim 5 wherein the coarse tuning port digital word is changed by said one bit subsequent to each selection of its corresponding frequency.

7. A method according to claim 6 wherin the least significant bit is changed to increase the value of the digital word when its corresponding error voltage is lower than the reference voltage and is changed to decrease the value of the digital word when its corresponding error voltage is higher than the reference voltage.

* * * * *